United States Patent [19]

Lovelace

[11] 4,430,580
[45] Feb. 7, 1984

[54] BISTABLE SWITCHING CIRCUIT

[75] Inventor: Ralph E. Lovelace, Los Gatos, Calif.

[73] Assignee: Signetics Corporation, Sunnyvale, Calif.

[21] Appl. No.: 299,275

[22] Filed: Sep. 4, 1981

[51] Int. Cl.$^3$ .................. H03K 3/023; H03K 3/288; H03K 3/295
[52] U.S. Cl. .................................. 307/288; 307/355; 307/299 B; 307/530; 307/279
[58] Field of Search ............... 307/288, 289, 355, 356, 307/362, 299 B, 290, 315, 530, 279

[56] References Cited

U.S. PATENT DOCUMENTS

| | | |
|---|---|---|
| 3,514,633 | 1/1966 | Schroeder . |
| 3,648,069 | 3/1972 | Frederiksen ..................... 307/362 |
| 3,805,093 | 4/1974 | Hodemaekers . |
| 3,848,139 | 11/1974 | Holt, Jr. . |
| 4,300,063 | 11/1981 | Dunphy et al. .................... 307/355 |
| 4,339,674 | 7/1982 | Hashimoto ......................... 307/362 |
| 4,348,602 | 9/1982 | Sauer ................................. 307/530 |

FOREIGN PATENT DOCUMENTS 53-108363 9/1978 Japan .

Primary Examiner—John Zazworsky
Attorney, Agent, or Firm—J. Dinardo; R. Meetin; T. Briody

[57] ABSTRACT

A bistable switching circuit contains a pair of like-polarity input transistor circuits (Q1 and Q2) arranged in a differential configuration to receive a corresponding pair of input signals. A pair of like-polarity cross-coupled transistor load circuits (Q3 and Q4) complementary to the input transistor circuits are coupled to them. A pair of resistive elements (R1 and R2) are coupled between a voltage supply ($V_{CC}$) and the load transistor circuits. An output transistor (Q5) complementary to the input transistor circuits has its control electrode and one of its flow electrodes coupled across one (Q4) of the load transistor circuits. When the input signals assume values capable of causing the output transistor to turn on, no current flows in the output transistor until regeneration occurs in the load transistor circuits—i.e., until they switch states.

25 Claims, 16 Drawing Figures

BISTABLE SWITCHING CIRCUIT

BACKGROUND OF THE INVENTION

This invention relates to a bistable switching circuit and particularly to a switching circuit of the kind that is responsive to a low level differential input.

Current Schmitt triggers are known which are used in combination with a differential input transistor pair. Examples of such circuits are described in U.S. Pat. No. 3,805,093 to Hodemaekers and U.S. Pat. No. 3,848,139 to Holt, Jr. However, neither of the patents disclose circuits which assure that no output current is present before regenerative transistor action occurs. This feature is a necessary requirement in some timers where the presence of negative feedback just prior to switching can prevent proper timer operation.

A threshold detector circuit employing cross coupled transistor pairs is disclosed in U.S. Pat. No. 3,514,633 to E. N. Schroeder. A bistable circuit employing a differential input transistor pair and complementary cross-coupled load transistors is disclosed in Japanese Patent Publication No. 53-108363 to Hiroshi Tamura, published Sept. 21, 1978.

SUMMARY OF THE INVENTION

A bistable switching circuit in accordance with the invention comprises first and second input transistor means connected differentially and provided with input electrodes for receiving a differential input signal. First and second load transistor means are coupled respectively to the first and second input transistor means and are cross-coupled with each other. The second load transistor means has a current gain of unity. First and second resistors are connected respectively to the first and second load transistor means. An output transistor is coupled to the second load transistor means and to the second resistor. The second load transistor means and the output transistor are complementary relative to the input transistor means. A constant current source is coupled in series with the differentially connected first and second input transistor means.

The load transistor means in combination with the output transistor comprise a current Schmitt trigger circuit. The circuit arrangement according to the invention assures that in switching from an off to on condition, no output current will be present until regenerative action in the Schmitt trigger circuit occurs, and regenerative action will occur when the differential input voltage is exactly at balance. The circuit furthermore exhibits a hysteresis effect, the amount of which is dependent on temperature and the beta of the first load transistor means. The hysteresis form of the transfer characteristic enhances the noise immunity of the circuit by rendering the circuit less sensitive to noise signals on the input.

The bistable switching circuit of the invention may be implemented in bipolar or MOSFET form.

DESCRIPTION OF THE PREFERRED EMBODIMENTS

Figure 1:
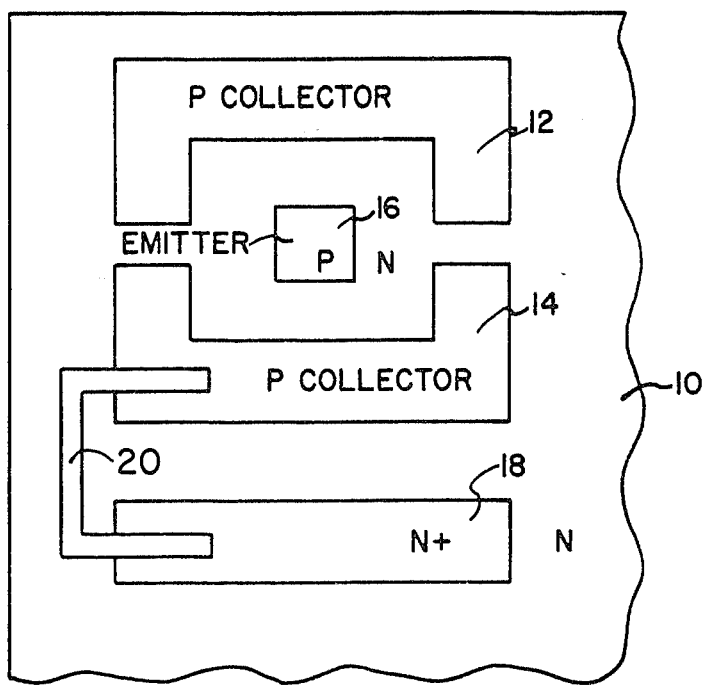
FIG. 1 is a diagramatic top view of a split collector transistor that is used in one embodiment of the bi-stable switching circuit according to the invention.

FIG. 1 is a diagramatic top view of a split collector transistor that is used in one embodiment of the bistable switching circuit according to the invention. The split collector transistor has unity gain and in the embodiment shown is a PNP transistor. In an N-type semiconductor region 10 there are provided two U-shaped P-type collector regions 12 and 14 facing each other. A P-type emitter region 16 is centrally located within the portion of the N-type region surrounded by the two P-type collector regions 12 and 14. The N region between the emitter region 16 and the collector regions 12 and 14 serves as a base. An N+ base contact region 18 is located to one side of one of the collector regions, in this case the collector region 14. The N+ base contact region 18 is short circuited to the collector region 14 by way of a conductor 20.

Figure 2:
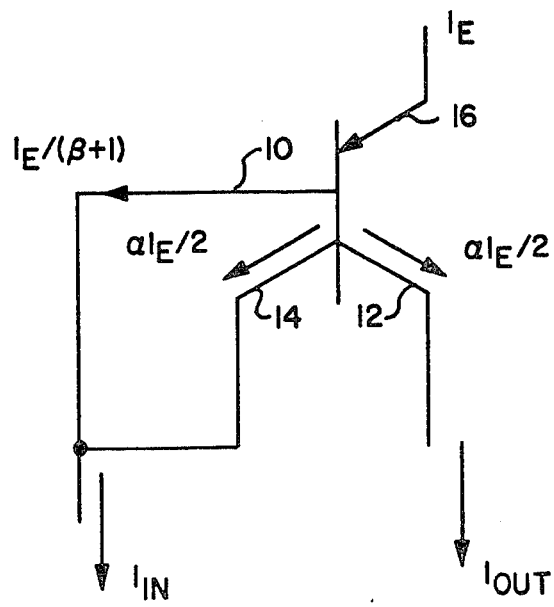
FIG. 2 is a schematic representation of the split collector transistor shown in FIG. 1.

A schematic representation of the split collector transistor is shown in FIG. 2. In operation, if $I_E$ is designated as the emitter current, then a current equal to $\alpha I_E/2$ goes to the first collector 12 and the same amount of current $\alpha I_E/2$ goes to the second collector 14. The current flowing into the base 10 is equal to $I_E/(\beta+1)$. If we define the input current as the current flowing to collector 14 plus the base current, and the output current as current flowing to the collector 12, then since $\alpha=\beta/(\beta+1)$, the ratio of the output current to the input current becomes $\beta/(\beta+2)$. As $\beta$ becomes fairly large, say 50 to 75, the ratio of the output current to the input current will approach 1 with fairly good accuracy.

Figure 3:
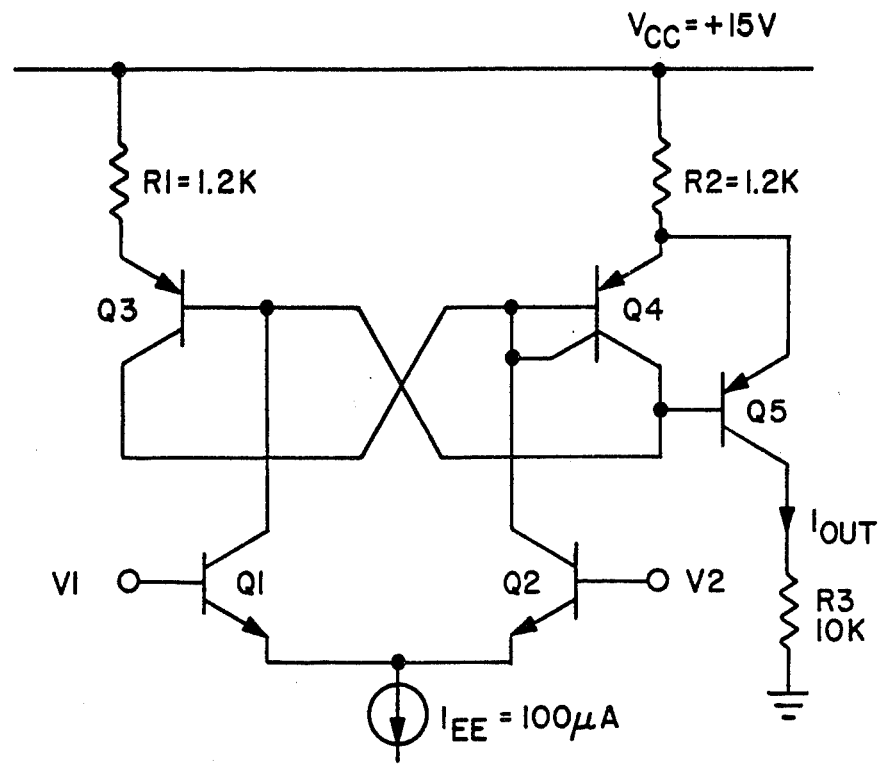
FIG. 3 is a schematic diagram of one embodiment of the bi-stable switching circuit of the invention incorporating bipolar transistors.

Reference is now made to FIG. 3 which shows one embodiment of the bistable switching circuit according to the invention. Two input transistors Q1 and Q2 are connected as a differential pair with their emitters connected in series with a source of constant current $I_{EE}$. The collector of transistor Q1 is connected to the base of a load transistor Q3, and the collector of transistor Q2 is connected to the base of a second load transistor Q4. The load transistors Q3 and Q4 in combination with an output transistor Q5 form a current Schmitt trigger circuit which responds to the difference between its two input currents. Q4 is a split collector transistor of the kind described in FIGS. 1 and 2. One collector of transistor Q4 is shorted to its base which, in turn, is connected to the collector of transistor Q3. The second collector of transistor Q4 is connected to the base of transistor Q3. Thus, the transistors Q3 and Q4 have cross coupled collectors and act as a flip-flop having two stable states.

The emitter of transistor Q3 is connected through a resistor R1 to a positive voltage supply $V_{CC}$ such as 15 volts. The emitter of transistor Q4 is connected through a resistor R2 to the voltage supply $V_{CC}$. The transistor Q4 is coupled to the output transistor Q5, which has its base connected to the cross-coupled collector of transistor Q4 and base of transistor Q3, its emitter connected to the emitter of transistor Q4, and its collector connected thorugh an output load resistor R3 to reference potential, such as ground. Input voltages to the bistable switching circuit are applied to the bases of the differential pair transistors Q1 and Q2 with input voltage V1 applied to the base of transistor Q1 and input voltage V2 applied to the base of transistor Q2.

Figure 3A:
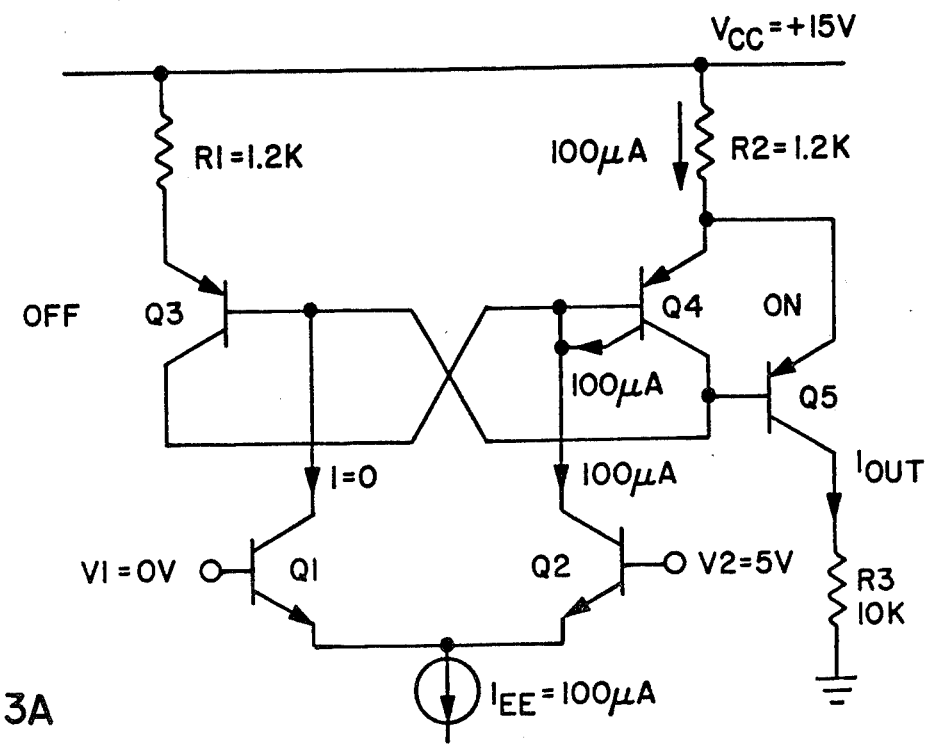
FIGS. 3A through 3E are schematic diagrams similar to FIG. 3 showing the currents flowing in different portions of the circuit under various conditions of differential input voltage.

The operation of the bistable switching circuit will now be described. Assume that source current $I_{EE}$ is 100 microamperes. Assume further that the initial or zero state conditions to be such that the voltage input V1 equals zero volts and the voltage input V2 equals 5 volts, as shown in FIG. 3A. In this case, all of the source current $I_{EE}$ flows in the collector of transistor Q2 and into the base-collector of transistor Q4. No part of the source current $I_{EE}$ flows in transistor Q1. Transistor Q4 is on and is saturated because there is no collector current being drawn out of it by transistor Q1, since transistor Q1 has zero current. The emitter current of transistor Q4 is 100 microamperes because all of the base current flows in the emitter.

Assuming the resistors R1 and R2 each to have a value of 1.2 kiloohms, the voltage drop across resistor R2 will be 120 millivolts. The voltage difference between the $V_{CC}$ supply and the base of transistor Q3 is equal to the 120 millivolt drop across resistor R2 plus the low saturation voltage of transistor Q4. This difference is perhaps another 120 millivolts, which is less than $V_{BE}$ necessary to turn transistor Q3 on. Therefore, transistor Q3 is off at this point. The voltage and current values are shown in FIG. 3A as they apply to the initial conditions just described.

Figure 3B:
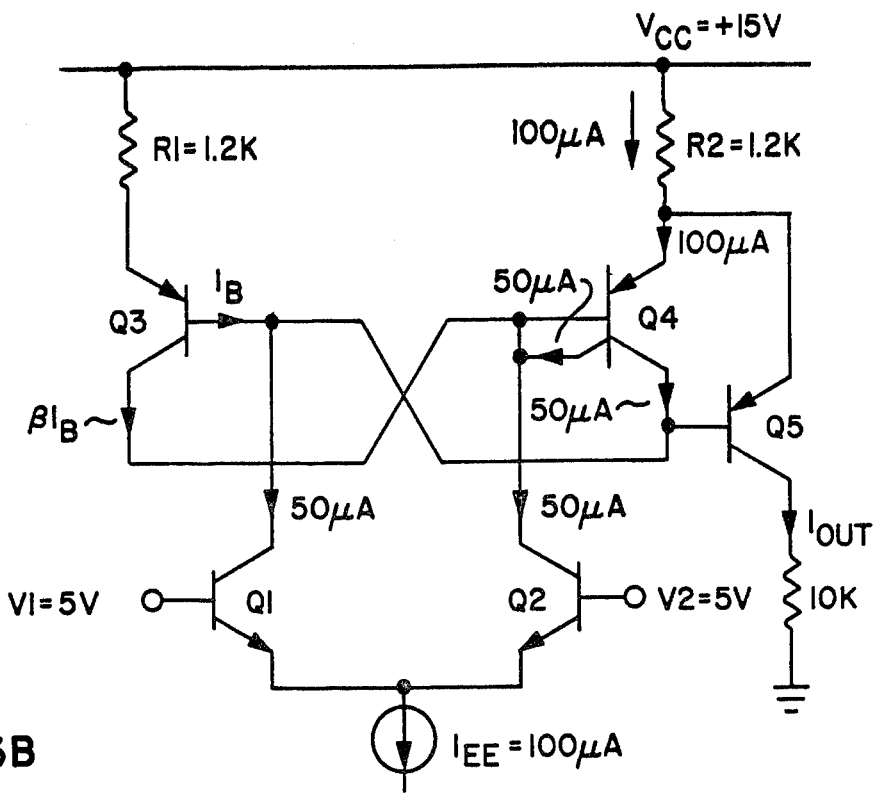

Reference is now made to FIG. 3B which shows the same circuit, but under different conditions. This condition can be termed the switching point condition where transistors Q1 and Q2 have the same input voltage. That is, the input voltage V1 is five volts and the input voltage V2 also is five volts. The source current $I_{EE}$ of 100 microamperes is split equally between transistors Q1 and Q2. Transistor Q2 has 50 microamperes of collector current and transistor Q1 also has 50 microamperes of collector current. At this point, transistor Q4 will come out of saturation and the voltage at the base of transistor Q3 will start to go lower and begin to turn transistor Q3 on. This occurs because of the unity gain condition of Q4 when it is in the active region and not saturated, which is the condition that prevails when the currents in the two collectors of transistor Q4 are equal. Stated differently, suppose the current of transistor Q2 were 51 microamperes and the current of transistor Q1 were 49 microamperes. Then the capability of transistor Q4 to supply collector current would be such that it could then supply 51 microamperes of collector current to transistor Q1. However, transistor Q1 only requires 49 microamperes, so transistor Q4 remains in saturation and has a low voltage drop across it. As soon as the collector current of transistor Q2 equals 50 microamperes and the collector current of transistor Q1 equals 50 microamperes, transistor Q4 comes out of saturation and the voltage at the base of transistor Q3 will start to go negative, which then starts to turn transistor Q3 on.

At this point it will be noted that the emitter current of transistor Q4 is still 100 microamperes, and it will remain at that level for a while, so that the voltage at the emitter of transistor Q5 is then 120 millivolts more negative than the supply voltage $V_{CC}$.

Transistor Q3 starts to turn on at a very low current and regeneration will occur around the loop at this low current. Positive feedback between transistors Q3 and Q4 necessary to cause regeneration will occur at the point where the beta ($\beta$) of Q3 is just greater than 1. This occurs because if a base current $I_B$ is pulled out of transistor Q3 a collector current of $\beta \times I_B$ will come out of transistor Q3 and will be fed to the base of transistor Q4 so as to decrease its collector currents. Transistor Q4 has unity gain, so the decreased current of the second collector is then fed back to the base of transistor Q3 to further increase its base current.

The typical small PNP transistors used in analog integrated circuits have decreasing beta at low current but still have a beta greater than 10 at 1 nanoampere of collector current, and under all conditions would have a beta greater than 1 at this current level. At 1 nanoampere the voltage drop across R1 is 1.2 microvolts and can be neglected. It can then be noted that $$V_{BE5} = V_{BE3} + I_{E4}R_2,\text{ or}$$

$$V_{BE5} = V_{BE3} + 120 \text{ millivolts,}$$

where
  $V_{BE5}$ is the base emitter voltage of transistor Q5,
  $V_{BE3}$ is the base emitter voltage of transistor Q3,
  $I_{E4}$ is the emitter current of transistor Q4.
From the basic diode equation $$V_{BE5} - V_{BE3} = \frac{kT}{q} \ln \frac{I_{C3}}{I_{C5}} = 120 \text{ millivolts,}$$

the collector current $I_{C5}$ of transistor Q5 can be computed, where
  k is Boltzmann's constant,
  T is absolute temperature,
  q is the charge of an electron,
  $I_{C3}$ is the collector current of transistor Q3.
From the above, the collector current of transistor Q5 is 1/100th of the 1 nanoampere collector current of transistor Q3, or $10^{-7}$ times full scale output of 100 microamperes. Even if beta were equal to 1 at 1 microampere, the voltage drop across resistor R1 would be a negligibly small value of 1.2 millivolts. Output current under these conditions would be 1/100th of 1 microampere or 0.0001 times full scale output of 100 microamperes and still can be neglected. It is thus shown that even with a condition much worse, by a factor of 1000, than ordinarily encountered, the output is still off until regeneration has already started.

Once the regeneration action starts, transistor Q3 will turn on and transistor Q4 will turn off. When transistor Q4 turns off, its emitter current of 100 microamperes will be removed and the emitter of Q5 will then be connected through resistor R2 to the supply voltage $V_{CC}$.

Figure 3C:
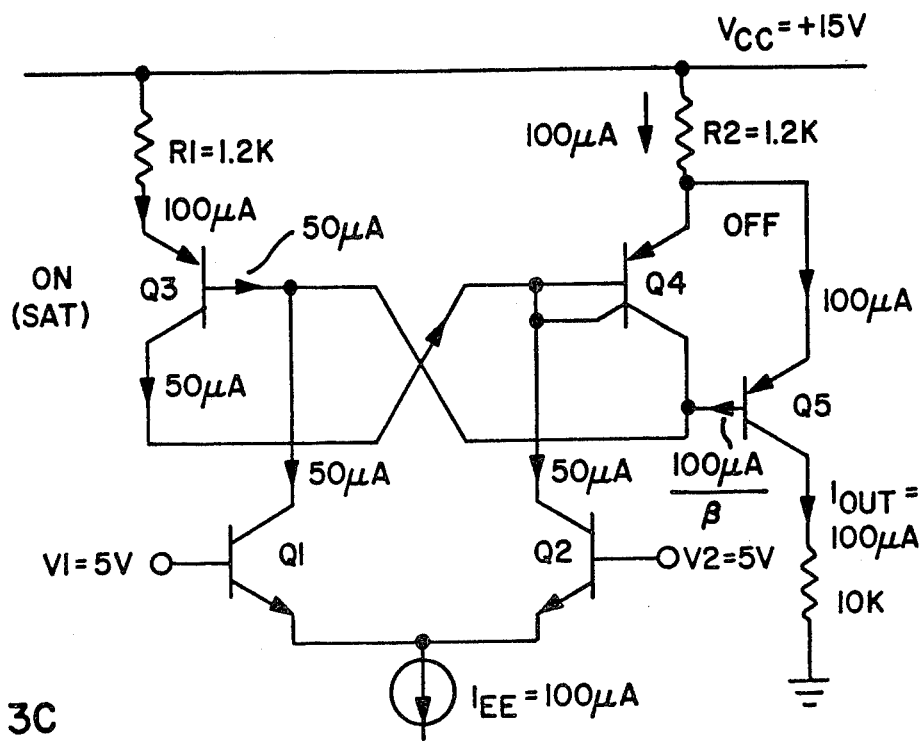

Referring to FIG. 3C which shows the conditions that prevail just after regeneration occurs but with input voltages V1 and V2 still balanced at 5 volts, the collector current of transistor Q3 becomes 50 microamperes and flows into the collector of transistor Q2. Similarly, the base current of transistor Q3 is also 50 microamperes and flows into the collector of transistor Q1. Transistor Q3 will then be turned on and in saturation with a forced beta of 1. Transistor Q3 will have a sufficiently low saturation voltage to keep transistor Q4 off and will have an emitter current of 100 microamperes. Since the base of transistor Q3 is connected to the base of transistor Q5 and they both have equal resistors of 1.2 kiloohms, transistors Q3 and Q5 will conduct the same amount of current equal to 100 microamperes as soon as regeneration is completed. This is the balance condition of the bistable switching circuit.

Figure 3D:
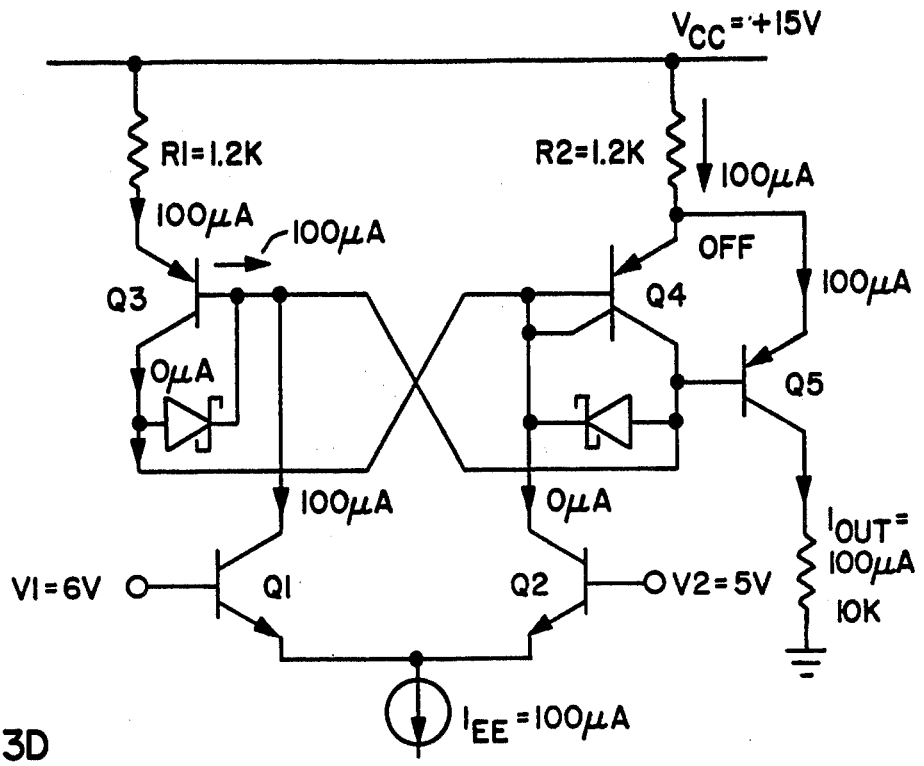

Reference is now made to FIG. 3D which shows the conditions that prevail when the input voltage V1 is greater than the voltage V2, say 6 volts for V1 and 5 volts for V2. In this case, all of the 100 microamperes of source current $I_{EE}$ flows in the collector of transistor Q1 and out of the base of transistor Q3. Transistor Q2 is off and the collector currents of transistors Q2 and Q3 are zero. However, since the emitter current of transistor Q3 is equal to the base current plus the collector current, the emitter current of transistor Q3 is still 100 microamperes. The voltage drop across resistor R1 is 120 millivolts and the bases of transistor Q3 and of transistor Q5 are 120 millivolts plus $V_{BE}$ below $V_{CC}$ so that the current in transistor Q5 is still 100 microamperes.

Figure 4:
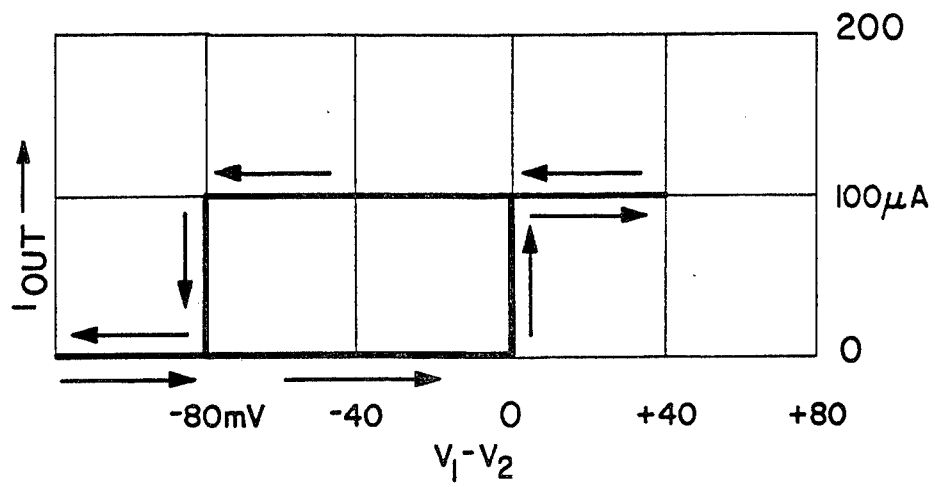
FIG. 4 is a graph showing the transfer characteristic of the bi-stable switching circuit shown in FIG. 3.

The above description is for the condition where there are no parasitics in the circuit. This condition can be realized by adding Schottky diodes across the collector-base junctions of transistors Q3 and Q4 as shown in FIG. 3D. The graph of FIG. 4 shows the transfer characteristic that applies to the above-described circuit operation of the bistable switching circuit. The graph shows the variation in output current as a function of input voltage. At the middle of the abcissa the input differential voltage V1−V2 is equal to zero; to the left of center V2 is greater than V1 so the difference is a negative value; to the right of center, V1 is greater than V2 so the difference is a positive value.

Starting with a large negative differential input voltage at the extreme lefthand portion of the graph and increasing the voltage in a positive direction from left to right, it will be seen that the output current is zero as it approaches zero differential input voltage. As voltage V1 is equal to V2, the current suddenly increases from zero to 100 microamperes. As the differential input voltage increases still further in a positive direction, the output current stays constant at 100 microamperes. Reversing the direction of the input voltage from positive to negative direction, the current stays constant as it passes the zero differential input voltage and beyond until a voltage of about −80 millivolts is reached, at which point the current falls sharply to zero and remains there as the differential input voltage increases further in the negative direction.

Figure 3E:
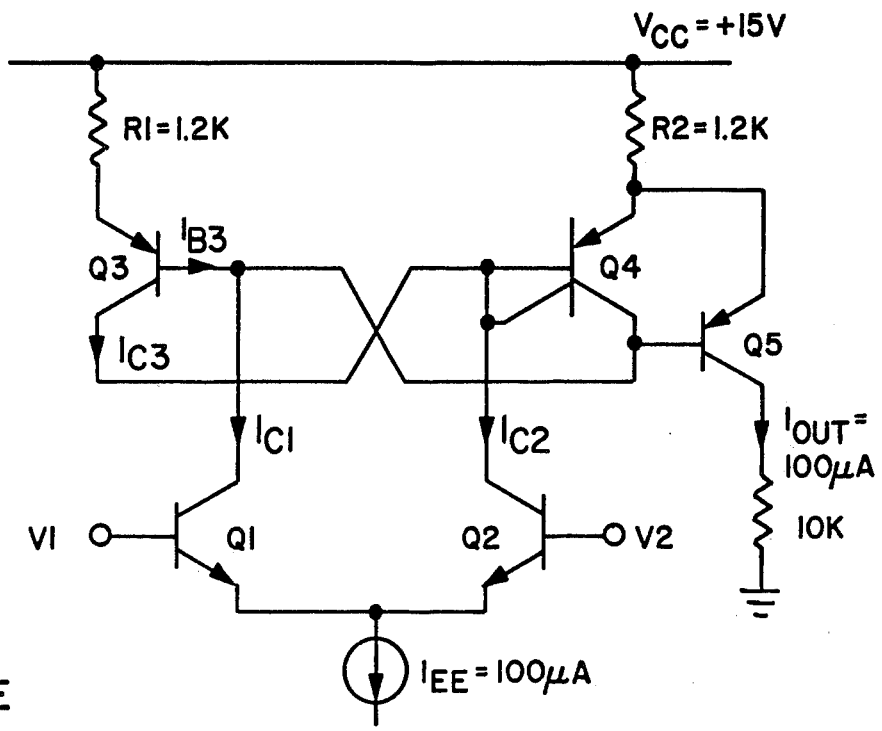

It is noted that the transfer characteristic of the bistable switching circuit has the form of a hysteresis loop. An explanation will now be given as to the conditions that determine the size of the hysteresis loop, that is, the conditions where the output transistor Q5 turns off as the input voltage proceeds in a negative direction beyond the balance point. Reference is made to FIG. 3E for this explanation. As long as $I_{C2}/I_{C1}$, the ratio of the collector currents of the two input stages, is less than the $\beta$ of transistor Q3, transistor Q3 will remain saturated and hold transistor Q4 off. At the point when $I_{C2}/I_{C1}$ is equal to $I_{C3}/I_{B3}$, which is the $\beta$ of transistor Q3, $I_{B3}$ being the base current of transistor Q3, transistor Q3 will come out of saturation. Q4 will turn on and regeneration will start and the circuit will switch back to its other state, which is Q4 on and Q3 off. The input voltage difference where this occurs is equal to $$\frac{kT}{q} \ln \frac{I_{C2}}{I_{C1}} = \frac{kT}{q} \ln \beta,$$

where $\beta$ is beta of transistor Q3. Therefore the amount of hysteresis depends upon the PNP transistor $\beta$ and temperature. A PNP transistor $\beta$ of 10 would give a hysteresis of 60 millivolts and a PNP $\beta$ of 100 would give a hysteresis of 120 millivolts, so the PNP transistor $\beta$ is somewhere between 10 and 100, and the hysteresis is nominally about 80 millivolts.

In an actual integrated circuit the PNP transistors Q3 and Q4 are lateral devices. When the lateral PNP transistor goes into saturation and its collector-base junction is forward biased, it forward biases the emitter-base junction of a parasitic substrate PNP transistor, which in the case of transistor Q4 appears between the base of transistor Q4, the collector of transistor Q4 and the substrate. The collector of transistor Q4 is the emitter of the parasitic transistor and the base of transistor Q4 is the base of the parasitic transistor. When the emitter base junction of the parasitic device is forward biased it draws a certain amount of current and increases the emitter current of transistor Q4 or Q3, depending upon which one is on. This does not affect the switch points of the circuit because at the switch point, the amount of forward bias on the base-collector junction of transistor Q4 or Q3 is removed and the PNP transistor comes out of saturation. The parasitic transistor thereupon is turned off, so that the switch points are not affected.

However, the amount of output current that is obtained from transistor Q5 when it turns on is a function of the current in Q3. When Q3 is on and is saturated, it actually has an extra emitter current of 300 microamperes which gives an actual output current from Q5 of 400 microamperes rather than 100 microamperes, and this will not harm the circuit operation in any way. The switch-off point of Q5 also occurs at the same point that occurs if the Schottky diodes are added between the base and collectors of transistors Q3 and Q4. Thus the switching points of transistor Q5 do not change, but the amplitude of the output current is somewhat higher. Moreover, with the Schottky diodes in the circuit, the current does not change when V1 goes higher than V2. However, without the Schottky diodes the output current increases further above the 400 microamperes that occurs at balance, when V1 goes above V2. From the standpoint of higher switching speed, it is desirable to include the Schottky diodes in the circuit in order to keep the PNP transistors Q3 and Q4 out of saturation.

Figure 5:
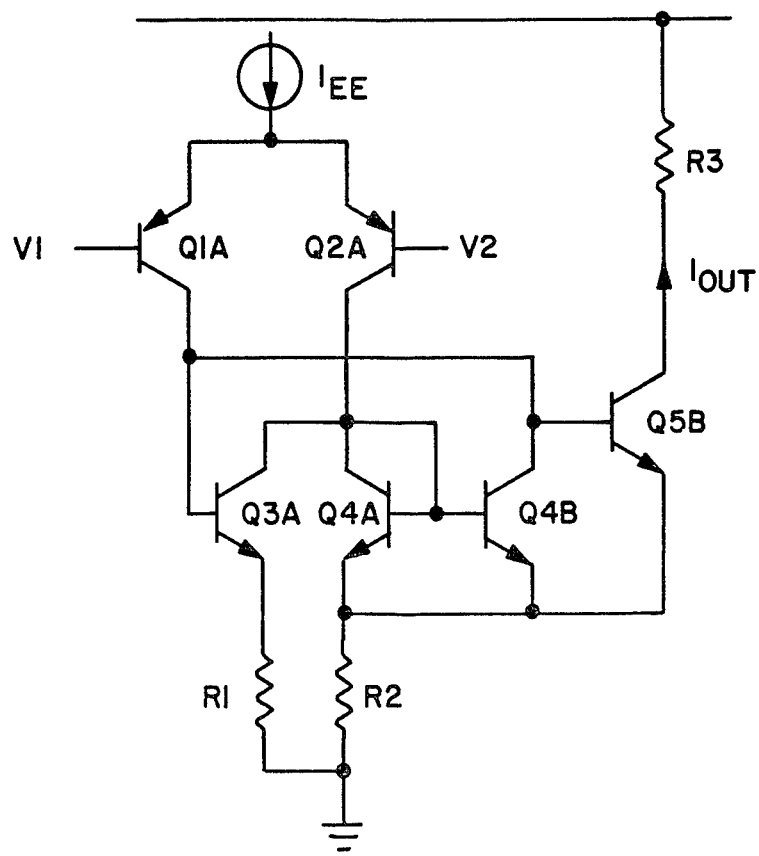
FIG. 5 is a schematic diagram of another embodiment of the bi-stable switching circuit of the invention that is the complement of the circuit of FIG. 3.

Another embodiment of the bistable switching circuit is illustrated in FIG. 5. In this embodiment, the PNP and NPN transistors are replaced with NPN and PNP transistors respectively. In addition, the split collector transistor Q4, which was a PNP transistor, is replaced by two separate transistors Q4A and Q4B, which are both NPN transistors, and which have their respective bases and emitters connected in common. One of the transistors Q4A is diode connected by having its base and collector connected together. The operation of this embodiment is similar to the operation of the previous embodiment and no further description is necessary.

Figure 6:
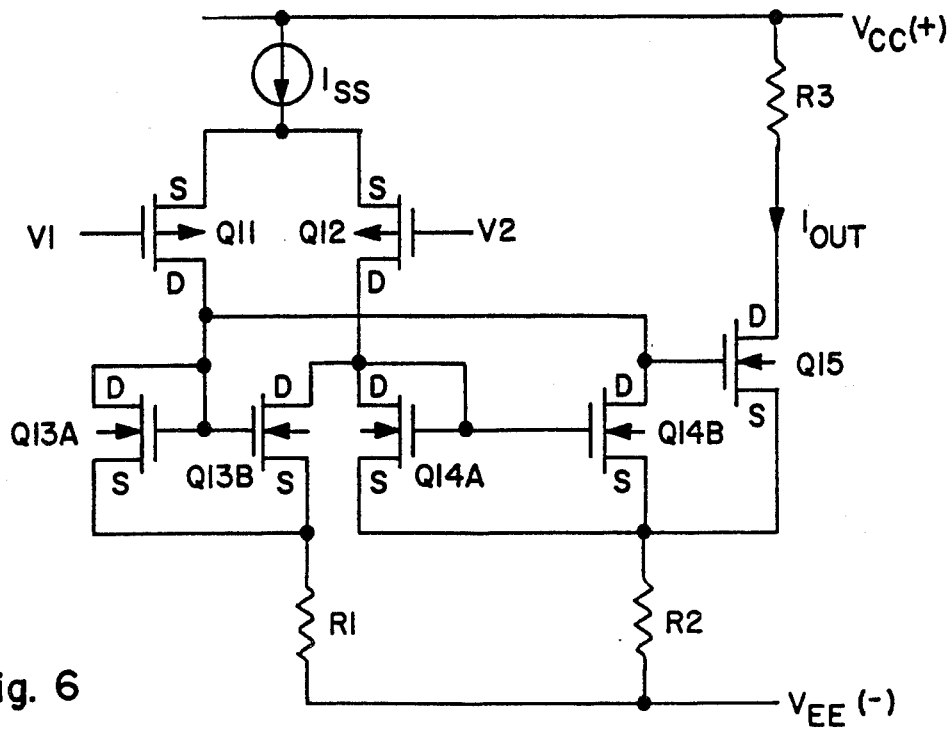
FIG. 6 is a schematic diagram of another embodiment of the bi-stable switching circuit of the invention incorporating MOS devices.

FIG. 6 shows another embodiment of the bistable switching circuit utilizing MOS enhancement devices in place of bipolar transistors. This circuit has a positive power supply $V_{CC}$ and a negative power supply $V_{EE}$. In this embodiment Q11 and Q12 are P-channel MOS devices and constitute the differential pair. Q13A and Q13B are N-channel MOS devices connected to the resistor R1 and perform the same function as does Q3 in FIG. 1. Q14A and Q14B are N-channel MOS devices, coupled to the resistor R2 and perform the same function as does transistor Q4 of FIG. 1. Q15 is an N-channel MOS device and functions as the output transistor similar to the function of output transistor Q5 of FIG. 1. The sources of the input transistors Q11 and Q12 are connected together to a current source supplying current $I_{SS}$.

The gates of transistors Q13A and Q13B are connected together. The sources of transistors Q13A and Q13B are connected together and to the resistor R1. The drain and gate of transistor Q13A are connected together and to the drain of transistor Q11. The gates of transistors Q14A and Q14B are connected together. The sources of transistors Q14A and Q14B are connected together and to the resistor R2. The drain and gate of transistor Q14A are connected together and to the drain of transistor Q12. The drain of transistor Q14B is connected to the drain of transistor Q11 and to the gate of transistor Q15. The source of transistor Q15 is connected to the resistor R2. The output current is taken from the drain of transistor Q15 and appears as a voltage across load resistor R3 connected to the positive power supply $V_{CC}$.

The transistors Q14A and Q14B are equal geometry devices which have a unity current gain function, the same as transistor Q4 in FIG. 1. Transistors Q13A and Q13B are proportioned such that the width of transistor Q13B is ten times the width of transistor Q13A, giving this combination an equivalent current gain of 10. Resistor R2 typically has a resistance such that it has a voltage drop across it of one half the threshold voltage of the N-channel devices with current $I_{SS}$ flowing through it.

Figure 6A:
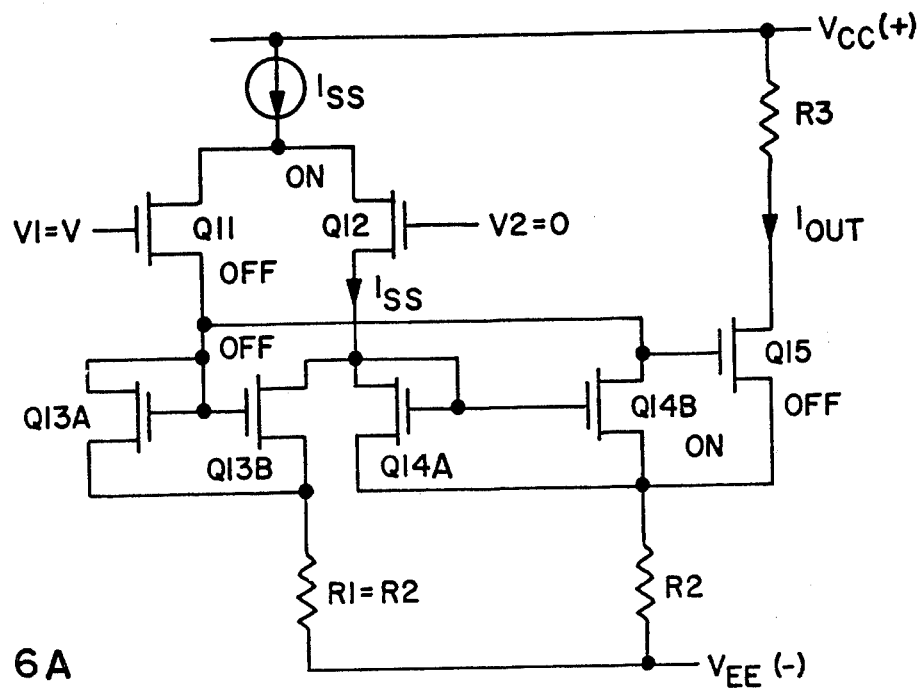
FIGS. 6A through 6C are schematic diagrams similar to FIG. 6 showing the currents flowing in different portions of the circuit under various conditions of differential input voltage.

In operation the voltage V1 is a positive value and the voltage V2 is zero. Under this condition, transistor Q12 will turn on and transistor Q11 will be off. This is illustrated in FIG. 6A. In this case, current equal to $I_{SS}$ flows through transistors Q12 and Q14A, and transistor Q14B will be on and will have the capability of having current equal to $I_{SS}$ flowing through it. Transistor Q14B will have a low voltage across it. Resistor R2 will have current equal to $I_{SS}$ flowing through it and will have a voltage drop of approximately one half the threshold voltage across it. Transistor Q11 is off and so are transistors Q13A and Q13B, and since transistor Q14B is on, transistor Q15 will be off.

Figure 6B:
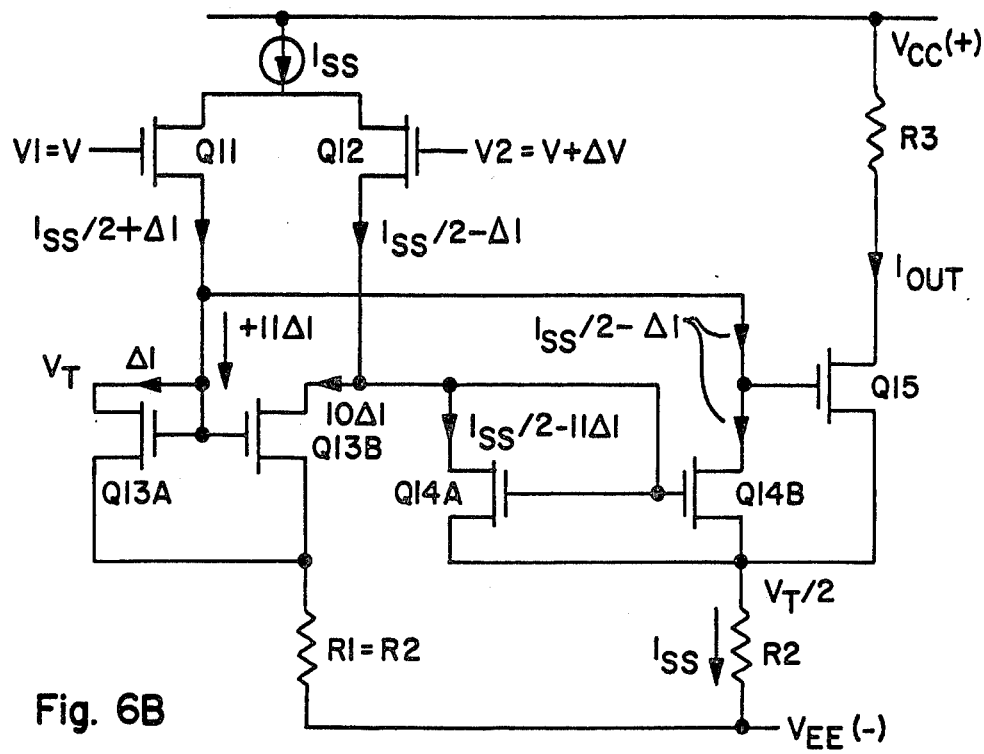

Reference is now made to FIG. 6B which illustrates the next stage in the operation of the circuit. The voltage V1 is still a positive voltage V and the voltage V2 has been increased to V+ΔV, so that V2 is slightly higher than V1. The current through transistor Q12 will be $(I_{SS}/2) - \Delta I$ and the current through transistor Q11 will be $(I_{SS}/2) + \Delta I$. At this time, transistor Q14B will come out of the on state. Looking at the other currents flowing in the circuit, there will be a current equal to $\Delta I$ flowing in transistor Q13A, making a current of $10\Delta I$ flowing in transistor Q13B. This will subtract from the current driving transistor Q14A, which becomes $(I_{SS}/2) - 11\Delta I$. Since there is a unity gain function between transistors Q14A and Q14B, the current conducting capability of transistor Q14B will be $(I_{SS}/2) - 11\Delta I$ which is the same as the current through transistor Q14A. Therefore, the current flowing in transistor Q13A will actually be increased by $11\Delta I$ and not simply $\Delta I$. Regeneration then occurs to switch the circuit to the other state. When regeneration starts the voltage at the gate of Q13 is $V_T$ and its source is $V_T/2$, assuring that transistor Q13 is still off. After regeneration occurs transistors Q14A and Q14B are turned off, transistor Q15 is turned on and transistors Q13A and Q13B are turned on, with transistor Q13B turned on hard. Transistor Q13B has more current capability than is required for it to conduct because it has a drive of $I_{SS}/2$ and a drain current of $I_{SS}/2$ and it has a current gain capability of 10.

Figure 6C:
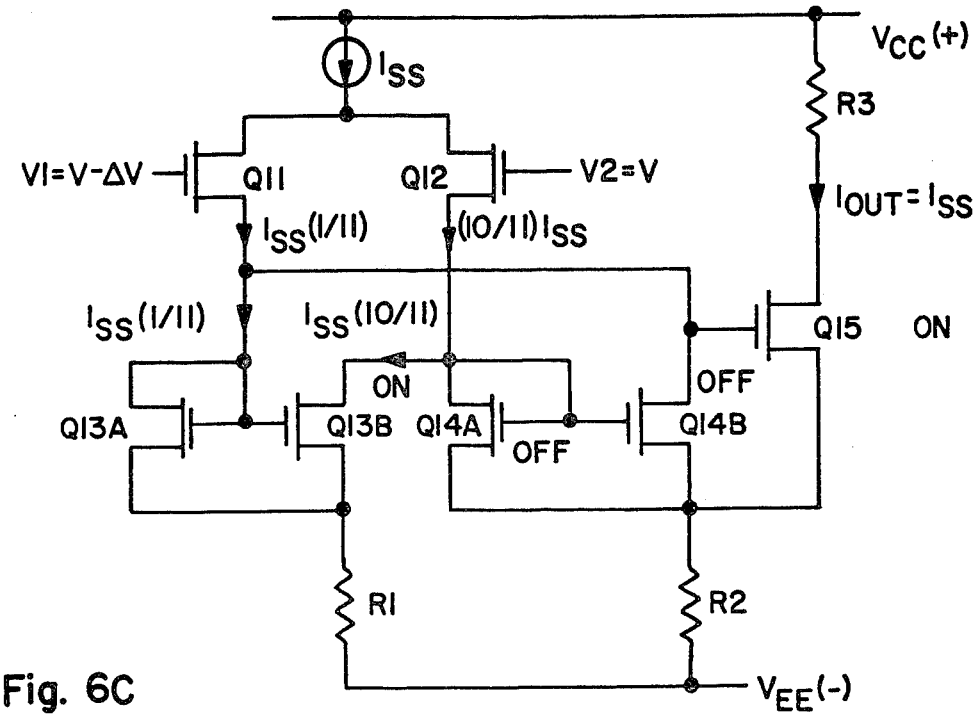

Reference is now made to FIG. 6C which illustrates the turn-off point at the end of the hysteresis loop where the input differential voltage is a negative value. This condition occurs when the current of transistor Q11 is 1/11th of $I_{SS}$ and the current of transistor Q12 is 10/11ths of $I_{SS}$, making the ratio of those two currents 10 to 1, which also happens to be the current gain of the combination of transistors Q13A and Q13B. The input voltage V2 is equal to V and the input voltage V1 is equal to $V - \Delta V$. The differential input is equal to $$2\left[\frac{4.5}{11} \times \frac{I_{SS}}{G_m}\right]$$

where $G_m$ is the transconductance of transistors Q11 and Q12. It can be seen that the turn off point occurs for a 10 to 1 current difference between transistors Q13A and Q13B. If the relative current gains of transistors Q13 and Q14 were a different ratio, for example 5 to 1, the turn off point would occur for a 5 to 1 current difference between transistors Q11 and Q12.

Therefore, it can be seen that the geometries of Q13A and Q13B can be adjusted to adjust the threshold at which the bistable switching circuit turns off. That is, the transition point of the hysteresis loop can be adjusted by adjusting the current gain of the current mirror comprising transistors Q13A and Q13B, so that the length to width ratio (L/W) of transistor Q13B is greater than the corresponding length to width ratio (L/W) of transistor Q13A.

Figure 7:
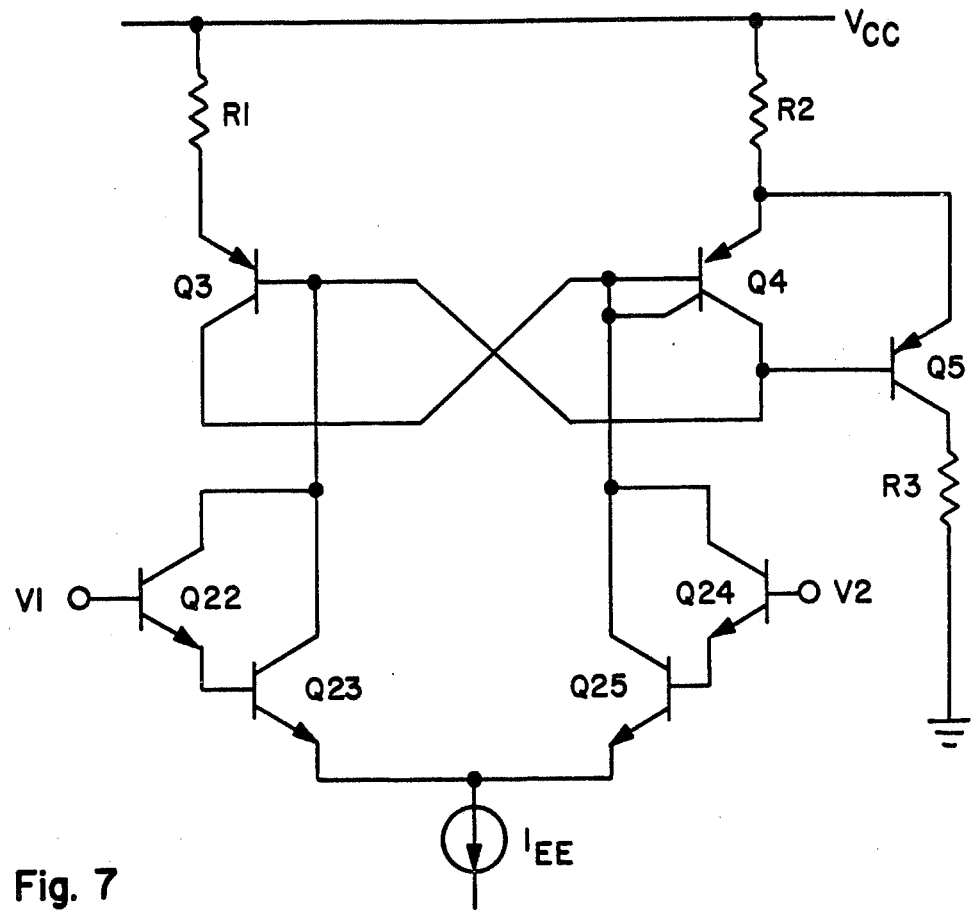
FIG. 7 is a schematic diagram of another embodiment of the bi-stable switching circuit of the invention incorporating bipolar transistors in a Darlington configuration.

Another embodiment using bipolar transistors is illustrated in FIG. 7. This embodiment is similar to that shown in FIG. 1, except that for the input transistors Q1 and Q2 there are substituted Darlington connected transistors Q22, Q23 and Q24, Q25.

Figure 8:
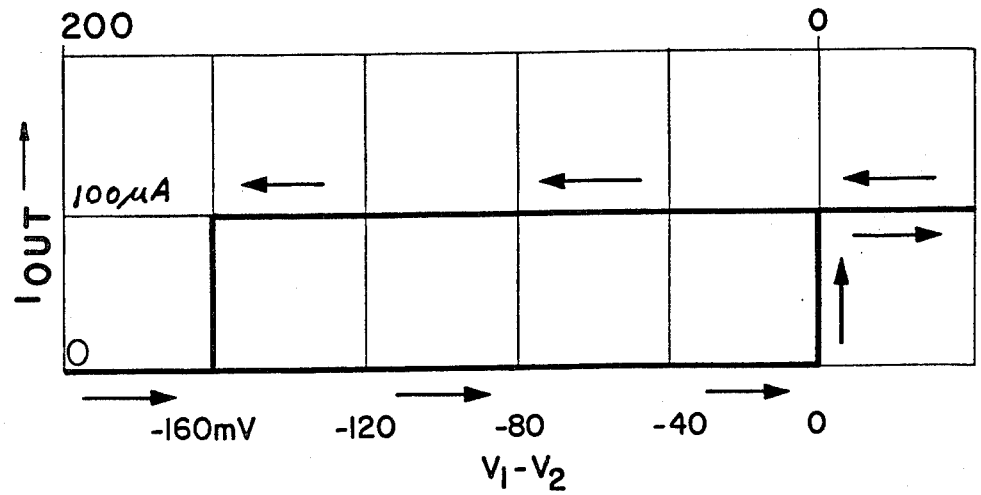
FIG. 8 is a graph showing the transfer characteristic for the circuit of FIG. 7.

The transfer characteristic for the circuit of FIG. 7 is shown in FIG. 8. As seen in FIG. 8, the turn on point again occurs at the balance condition of the bistable switching circuit where V1−V2=0 volts. However, the hysteresis curve is twice as wide as was the case with the circuit of FIG. 1 because there are twice as many junctions in the Darlington embodiment which each have current ratio, of β PNP so that the circuit will switch off when the differential input equals (2kT/q) 1 n β.

What is claimed is:

1. A bistable switching circuit comprising:
a substantially constant current source;
like-polarity first and second input transistor means, each having an input control electrode for receiving an input signal, a first flow electrode, and a second flow electrode, the first flow electrodes being coupled in common to the current source;
like-polarity first and second load transistor means complementary to the input means, each load means having a first flow electrode, the first load means having a second flow electrode coupled to the second flow electrode of the second input means and having a control electrode coupled to the second flow electrode of the first input means, and the second load means having a second flow electrode coupled to the second flow electrode of the first input means and having a control electrode coupled to the second flow electrode of the second input means;
an output transistor complementary to the input means, the output transistor having a control electrode coupled to the second flow electrode of the first input means, a first flow electrode, and a second flow electrode from which an output signal is available; and
first and second resistive elements, the first resistive element being coupled between a voltage supply and the first flow electrode of the first load means, one end of the second resistive element being coupled to the voltage supply, and the other end of the second resistive element being coupled in common to the first flow electrodes of the output transistor and the second load means.

2. A circuit as in claim 1 wherein: the currents through the control and second flow electrodes of the second load means are substantially equal when it is in its active operating range; and the input means have substantially equal current transmission capabilities.

3. A circuit as in claim 2 wherein the ratio of the current through the second flow electrode of the first load means to the current through the control electrode of the first load means reaches a value greater than unity in the active operating range of the first load means.

4. A circuit as in claim 3 further including a third resistive element coupled between another voltage supply and the second flow electrode of the output means.

5. A circuit as in claim 3 wherein the means are bipolar.

6. A circuit as in claim 5 wherein the second load means comprises a transistor having a base, an emitter, a first collector connected to the base, and a second collector such that the control, first flow, and second flow electrodes of the second load means respectively are the interconnection of the base and first collector, the emitter, and the second collector.

7. A circuit as in claim 6 wherein the collectors have approximately equal lateral areas in a semiconductor device.

8. A circuit as in claim 6 wherein the first load means comprises a transistor having a base, an emitter, and a collector which respectively are the control, first flow, and second flow electrodes of the first load means.

9. A circuit as in claim 8 wherein the output transistor has a base, an emitter, and a collector which respectively are the control, first flow, and second flow electrodes of the output transistor.

10. A circuit as in claim 9 wherein each input means comprises a transistor having a base, an emitter, and a collector which respectively are the control, first flow, and second flow electrodes of that input means.

11. A circuit as in claim 10 wherein each transistor of the input means is NPN type.

12. A circuit as in claim 9 wherein each input means comprises first and second transistors, the first transistor having a base, an emitter, and a collector, the second transistor having a base coupled to the emitter of the first transistor, an emitter, and a collector, and the control, first flow, and second flow electrodes of that input means respectively being the base of the first transistor, the emitter of the second transistor, and the collector of the second transistor.

13. A circuit as in claim 12 wherein the collectors of the transistors in each input means are connected together.

14. A circuit as in claim 5 wherein the second load means comprises first and second transistors, the first transistor having a base, an emitter, and a collector connected to the base, the second transistor having a base connected to the other base, an emitter connected to the other emitter, and a collector, and the control, first flow, and second flow electrodes of the second load means respectively being the interconnection of the bases with the collector of the first transistor, the interconnection of the emitters, and the collector of the second transistor.

15. A circuit as in claim 14 wherein the first load means comprises a transistor having a base, an emitter, and a collector which respectively are the control, first flow, and second flow electrodes of the first load means.

16. A circuit as in claim 15 wherein the output transistor has a base, an emitter, and a collector which respectively are the control, first flow, and second flow electrodes of the output transistor.

17. A circuit as in claim 16 wherein each input means comprises a transistor having a base, an emitter, and a collector which respectively are the control, first flow, and second flow electrodes of that input means.

18. A circuit as in claim 3 wherein the means are MOS.

19. A circuit as in claim 18 wherein the first load means comprises first and second transistors, the first transistor having a gate, a source, and a drain connected to the gate, the second transistor having a gate connected to the other gate, a source connected to the other source, and a drain, and the control, first flow, and second flow electrodes of the first load means respectively being the interconnection of the gates with the drain of the first transistor, the interconnection of the sources, and the drain of the second transistor.

20. A circuit as in claim 19 wherein each load means comprises first and second transistors, the first transistor having a gate, a source, and a drain connected to the gate, the second transistor having a gate connected to the other gate, a source connected to the other source, and a drain, and the control, first flow, and second flow electrodes of that load means respectively being the interconnection of the gates with drain of the first transistor, the interconnection of the sources, and the drain of the second transistor.

21. A circuit as in claim 20 wherein the width of the first transistor of the first load means is greater than the width of the second transistor of the first load means in a semiconductor device.

22. A circuit as in claim 20 wherein the transistors of the second load means have substantially equal widths in a semiconductor device.

23. A circuit as in claim 19 wherein the output transistor has a gate, a source, and a drain which respectively are the control, first flow, and second flow electrodes of the output transistor.

24. A circuit as in claim 23 wherein each input means comprises a transistor having a gate, a source, and a drain which respectively are the control, first flow, and second flow electrodes of that input means.

25. A circuit as in claim 24 wherein each transistor of the input means is P-channel.

* * * * *